(12) United States Patent
Lin (10) Patent No.: US 7,417,692 B2
(45) Date of Patent: Aug. 26, 2008

(54) LASER REPAIR STRUCTURE AND METHOD FOR TFT-LCD

(75) Inventor: Chun-An Lin, Taoyuan (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 313 days.

(21) Appl. No.: 11/327,385

(22) Filed: Jan. 9, 2006

(65) Prior Publication Data

US 2007/0158655 A1    Jul. 12, 2007

(51) Int. Cl.
*G02F 1/1334* (2006.01)

(52) U.S. Cl. .............................. 349/38; 349/39; 349/54; 349/55; 349/192

(58) Field of Classification Search .................... 349/38, 349/39, 54, 55, 192
See application file for complete search history.

(56) References Cited

U.S. PATENT DOCUMENTS 6,882,375 B2    4/2005    Kim

2005/0157220 A1    7/2005    Kim
2006/0092342 A1*   5/2006    Lee .............................. 349/38

FOREIGN PATENT DOCUMENTS

| JP | 9-113930 A | 5/1997 |
|----|------------|--------|
| JP | 2004-54069 A | 2/2004 |

* cited by examiner

*Primary Examiner*—Frank G Font
*Assistant Examiner*—Mary A El Shammaa
(74) *Attorney, Agent, or Firm*—Jianq Chyun IP Office (57) ABSTRACT

A laser repair structure and method for TFT panel. A first metal conductor is located in the source-drain layer and having a contact hole to the pixel electrode, and the region of the first metal conductor is within the region of the storage capacitance line. To repair a white defect of a pixel, make extending portions of the first metal conductor to overlap with the gate line of the previous pixel so as to electrically connect them by the laser irradiation. Another choice is setting two second metal conductors located in the gate-electrode layer and partially overlapped with the data line and the first conductor separately, then using laser irradiation to electrically connect one second metal conductor to repair the white defect of a pixel or electrically connect two second metal conductors to repair an open-circuited data line.

7 Claims, 6 Drawing Sheets

LASER REPAIR STRUCTURE AND METHOD FOR TFT-LCD

BACKGROUND OF THE INVENTION

1. Field of the Invention

The present invention relates to a Thin Film Transistor-Liquid Crystal Display (TFT-LCD), and more particularly, to a structure and method for laser repair to enhance the display quality.

2. Description of the Prior Art

Generally, a TFT-LCD panel has a liquid crystal layer sandwiched by two substrates with electrodes thereof. The light transmittance of the LCD can be controlled by applying voltages to the respect electrodes.

The display region of a TFT panel contains a plurality of pixels arranged in a matrix type. A pixel is a rectangle region defined by the crossing of two gate lines and two data lines. In addition to a pixel electrode, there are a TFT element and a storage capacitor contained in the pixel. The TFT is a switching element in which the on-off state is controlled by both the scanning signals from the gate line and the data signals from the data line. A storage capacitance line is provided in the pixel to form a capacitor that can maintain the present pixel signal of the pixel electrode until the subsequent signal is applied thereto.

It is known that the TFT-LCD has been developed towards the television application in recent years, so the display panel has been promoted to the large-scale design. Consequently, the fabrication process is more and more complex and difficult. It is hard to consider the influences of both the constraint conditions and the process errors on the display quality at the same time for the TFT-LCD design, although they are the key factors to affect the productivity and the yield.

During the procedures of fabricating the TFT panel, the pixel is liable to be damaged by several factors such as the unexpected particle pollution and the static electricity. A line defect means a broken signal line, and a pixel defect means the abnormal short or open circuits of TFT.

The pixel defects can be distinguished as several kinds such as the white defect, the black defect, and the dull defect, etc. Since the white defect is always bright that is very easy to be recognized by a human's eyes, it is preferable that the white defect is repaired to be a black defect that is always dark. Or at least, the white defect needs to be shifted into a dull defect that is always slightly bright.

Generally, a laser repair method will be executed when just a few white defects occur.

Figure 1:
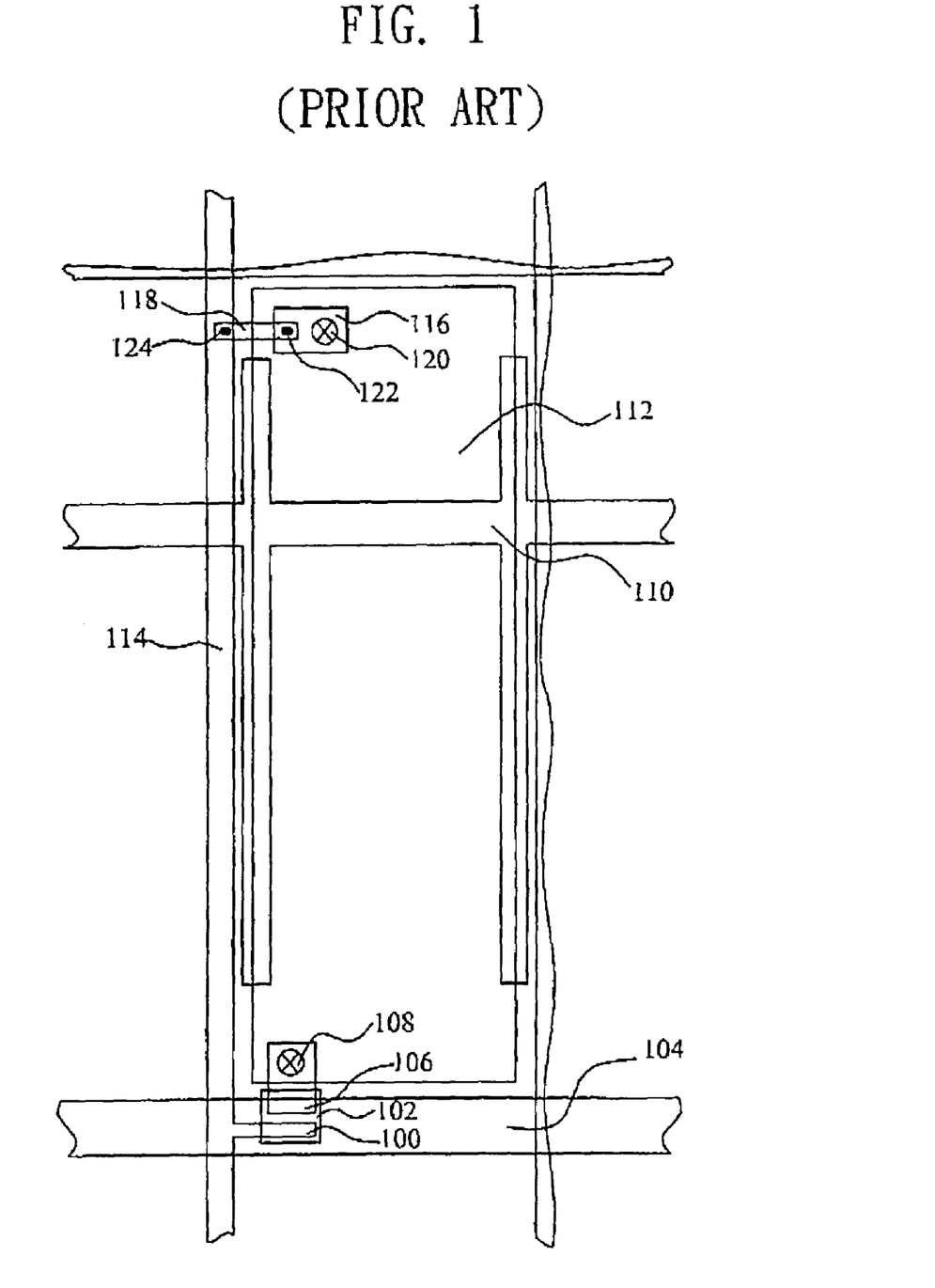
FIG. 1 is a top-view schematic diagram of a pixel with the conventional laser repair structure in a TFT panel for a first prior art.

A top-view schematic diagram of a pixel with the conventional laser repair structure in the TFT panel is illustrated in FIG. 1. Data line 114 transmits the data signal to the source electrode 100, and the gate signal is transmitted by the gate line 104 that is located in the gate-electrode layer on the upper surface of a transparent glass substrate. A storage capacitance line 110, which is located in the gate-electrode layer, is provided in the pixel to transmit the common voltage. The semiconductor electrode 102 is partially covered by the source electrode 100 and the drain electrode 106, and the contact hole 108 is to electrically connect the pixel electrode 112 and the drain electrode 106. One additional metal conductor 116, which is located in the source-drain layer under the pixel electrode 112 and is electrically connected to the pixel electrode 112 through the contact hole 120, is prepared for the required laser repair. Another additional metal conductor 118, which is located in the gate-electrode layer and is normally floating, is also prepared for the required laser repair. The metal conductor 118 is partially overlapped with the data line 114 and the metal conductor 116 at the portions 124 and 122 separately.

Once the white defect of the pixel has been found, the laser beams can be used to irradiate the overlapped portions 124 and 122 from the lower surface side of the transparent glass substrate to electrically connect the data line 114 and the metal conductor 116. Then, the data signal can directly transmit to the pixel electrode 112 through the contact hole 120 so as to convert the white defect into a dull defect.

However, this laser repair structure for repairing white defect needs an additional metal conductor with a contact hole located in the source-drain layer under the pixel electrode. Thus, the additional metal conductor will decrease the aperture ratio of the pixel.

Except for the pixel defect of the TFT panel, line defect is also happened in the manufacturing procedures. It needs to be repaired, too.

Figure 2:
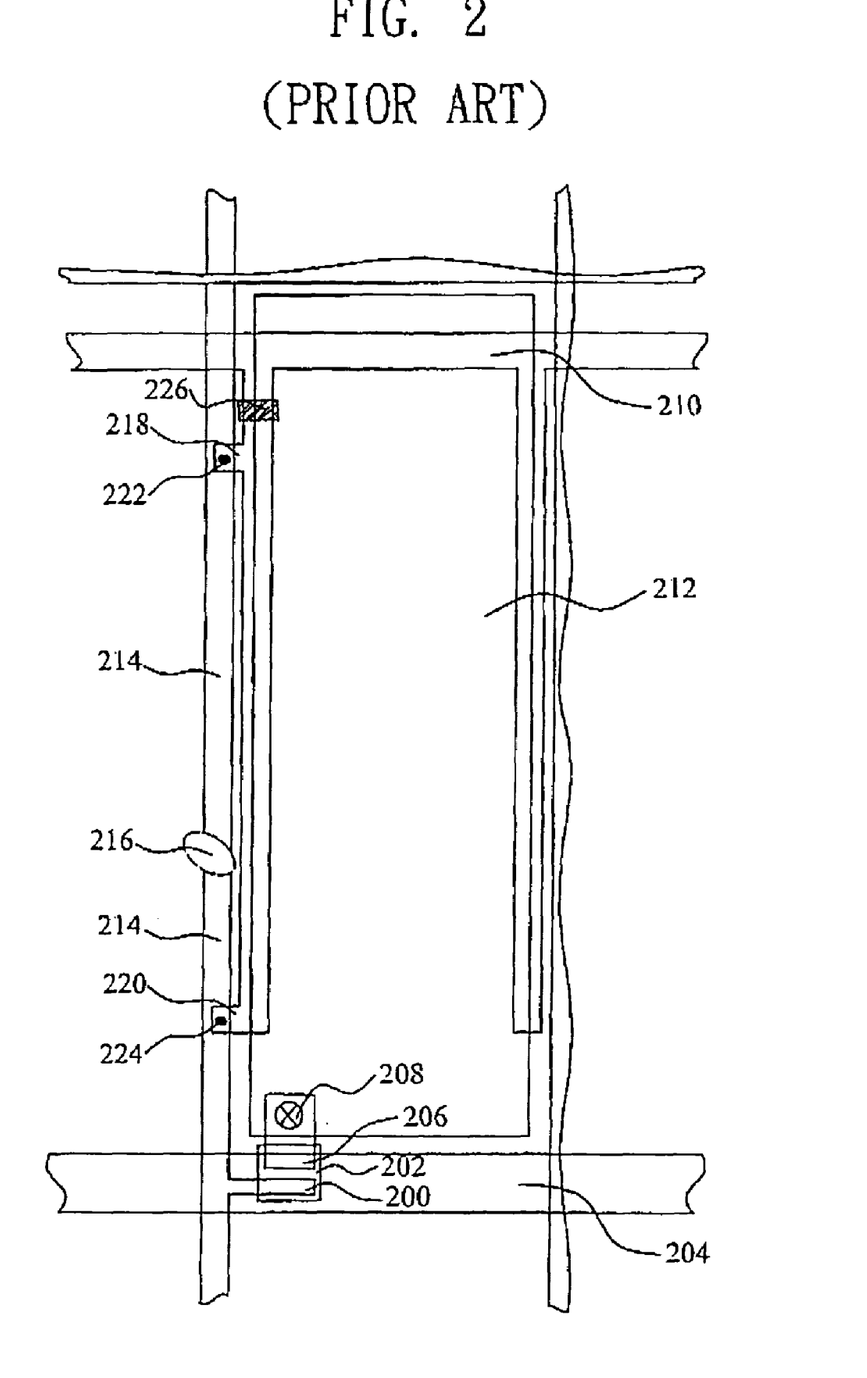
FIG. 2 is a top-view schematic diagram of a pixel with the conventional laser repair structure in a TFT panel for a second prior art.

FIG. 2 is a top-view schematic diagram of a pixel in the TFT panel, which shows a conventional laser repair structure for a pixel having an open-circuited portion 216 in the data line 214. The gate signal is transmitted by the gate line 204 that is located in the gate-elcetrode layer onto upper surface of a transparent glass substrate. Because the data line 214 has an open-circuited portion 216, it fails to transmit the data signal to all the source electrodes connected to it including the source electrode 200 of this pixel. A storage capacitance line 210, which is located in the gate-electrode layer, is provided in the pixel to transmit the common voltage. The semiconductor electrode 202 is partially covered by the source electrode 200 and the drain electrode 206, and the contact hole 208 is to electrically connect the pixel electrode 212 and the drain electrode 206. Two repair members 218, 220 are extended front the storage capacitance line 210 and overlapped with the data line 214 at the extending portions 222, 224 separately, which are prepared for the required laser repair.

Once an open-circuited portion 216 of the data line 214 has been found, the laser beams can be used to irradiate the overlapped portions 222 and 224 from the lower surface side of the transparent glass substrate to electrically connect the data line 214 and the storage capacitance line 210. Then, using a low-energy laser to irradiate the location 226 to evaporate some portion of the pixel electrode 212. Thereafter, using a high-energy laser to irradiate the location 226 to evaporate some portion of the storage capacitance line 210 until the storage capacitance line 210 is open circuit in the location 226. Therefore, the data line 214 is repaired by using some portion of the storage capacitance line 210 and the data signal can be transmitted to all the source electrodes connected to it.

However, it is not easy to control in melting the pixel electrode by the laser because the pixel electrode is normally constituted by the indium tin oxide (ITO) or the indium zinc oxide (IZO). This kind of laser repair structure and method for line defect needs to use a low-energy laser to evaporate some portion of the pixel electrode, so it's very hard to control.

Consequently, such a laser repair structure and method for line defect is very complicated and risky. Furthermore, it is easy to cause a bad short-circuit between the data line and the storage capacitance line when doing the laser repairing because it use the storage capacitance line as a lead, and so as to result in a low repair yield.

SUMMARY OF THE INVENTION

In order to solve the aforementioned problems of the prior art, the present invention provides a convenient and easy way to repair a white defect of the pixel by first setting up a first metal conductor located in the source-drain layer and having a contact hole to the pixel electrode.

One purpose of the present invention is to provide a structure of TFT panel capable of being repaired without the decrease of aperture ratio. The region of the first metal conductor for repairing is within the region of the storage capacitance line, so that the aperture ratio of the pixel will not decrease.

There are two kinds of embodiments of the present invention to repair a white defect of the pixel. One kind of embodiment is to make extending portions of the first metal conductor to overlap with the gate line of the previous pixel such that they may be electrically connected by the laser irradiation in the following repair step. This kind of structure and method will repair a white defect to a dark defect.

Another kind of embodiment of the present invention is to setup second metal conductors located in the gate-electrode layer and partially overlapped with the data line and the first conductor separately such that they may be electrically connected by the laser irradiation in the following repair step. This kind of structure and method will repair a white defect to a dull defect.

In additional to repair the pixel defect, this kind of structure can repair an open-circuited data line by setting up two second metal conductors. Accordingly, the present invention has a purpose that it can repair not only a pixel defect but also a line defect of the data line.

One purpose of the present invention is that it is not necessary to use a laser to melt the pixel electrode.

Another purpose of the present invention is that there is no additional photo mask or fabricating process compared to the TFT panel without the repair structure is needed to practice the present invention.

Consequently, the present invention of the laser repair structure and method can effectively elevate the repair yield and lower down the production cost.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 3A:
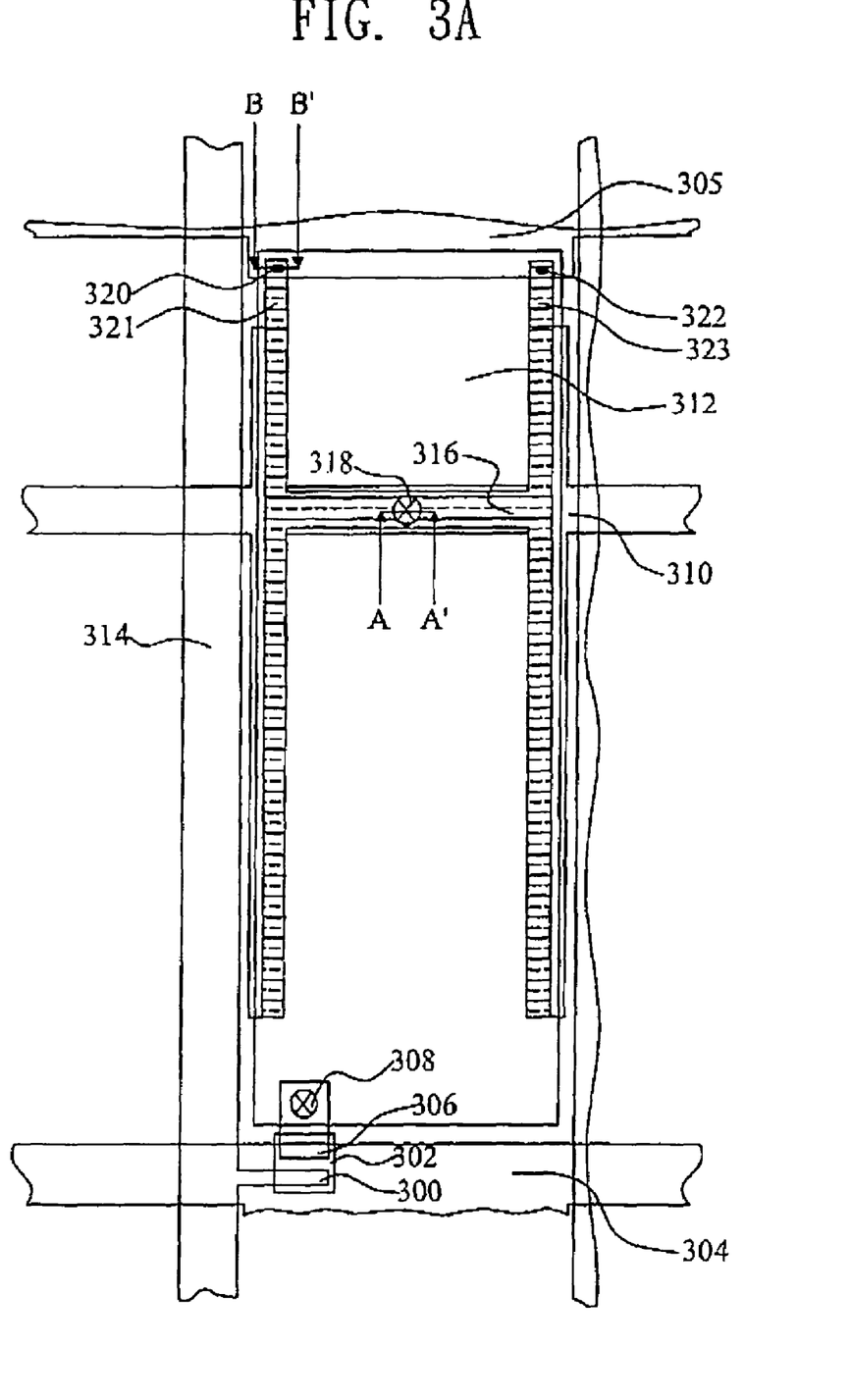
FIG. 3A is a top-view schematic diagram of a pixel with the laser repair structure in a TFT panel according to a first embodiment of the present invention.

The FIG. 3A is a top-view schematic diagram of a pixel with the laser repair structure in a TFT panel according to one embodiment of the present invention. Data line 314 transmits the data signal to the source electrode 300, and the gate signal is transmitted by the gate line 304 of the current pixel. A storage capacitance line 310, which is located in the gate-electrode layer, is provided in the pixel to transmit the common voltage. The semiconductor electrode 302 is partially overlapped with the source electrode 300 and the drain electrode 306. The contact hole 308 electrically connects the pixel electrode 312 and the drain electrode 306. An additional metal conductor 316, which is located in the source-drain layer over the storage capacitance line 310, has two extending portions 321, 323 configured for the required laser repair. The region of the metal conductor 316 is within the region of the storage capacitance line 310 except for two extending portions 321, 323 which are extended from the edge of the storage capacitance line 310 thereto and overlapped with the gate line 305 of the previous pixel at the portions 320, 322. Normally the material of the metal conductor 316 is one or combination selected from the group consisting of Al, Cu, Au, Cr, Ta, Ti, Mn, Ni, Mo, Nb, Nd, and Ag.

Figure 3B:
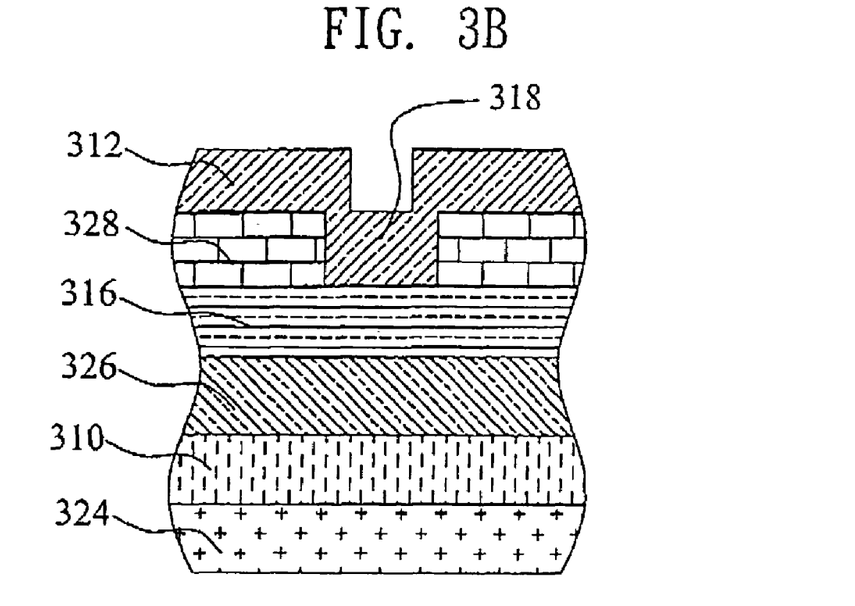
FIG. 3B is a cross-sectional schematic diagram taken from the cross-line A-A' in FIG. 3A to illustrate a pixel with the laser repair structure in a TFT panel.

FIG. 3B is a cross-sectional schematic diagram taken from the cross-line A-A' in FIG. 3A. A gate insulator 326 is intervened between the metal conductor 316 and the storage capacitance line 310 on a substrate 324. Normally the material of the substrate 324 is transparent glass. Between the metal conductor 316 and the pixel electrode 312, a passivation insulator 328 is located except for the region of the contact hole 318 that is to electrically connect the metal conductor 316 to the pixel electrode 312. The gate insulator 326 and the passivation insulator 328 are often composed of oxide or nitride, and the conductive pixel electrode 312 is usually composed of indium tin oxide (ITO) or indium zinc oxide (IZO).

Figure 3C:
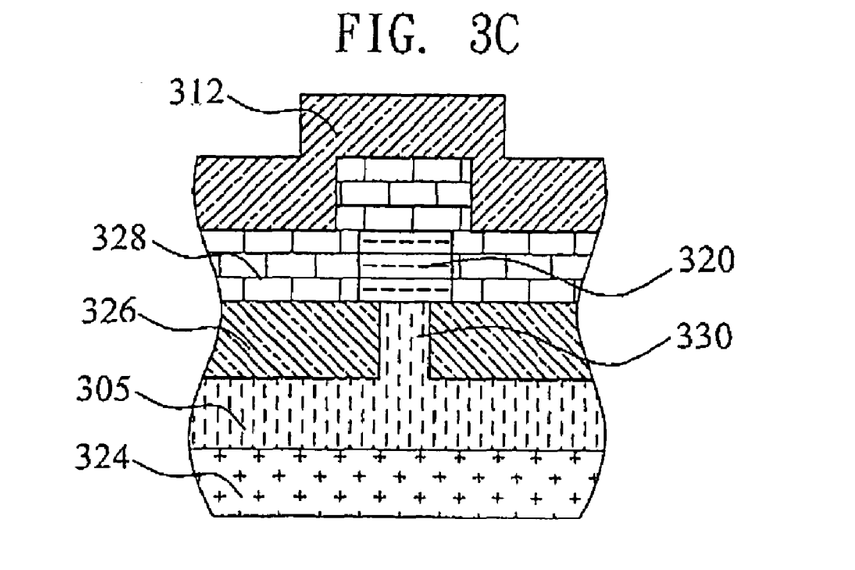
FIG. 3C is a cross-sectional schematic diagram taken from the cross-line B-B' in FIG. 3A to illustrate a pixel with the laser repair structure in a TFT panel after being irradiated by the laser.

Once a white defect of the pixel has been found, the laser beams may be used to irradiate either one of the two overlapping portions 320, 322 from the lower surface side of the substrate 324. FIG. 3C is a cross-sectional schematic diagram taken from the cross-line B-B' in FIG. 3A to illustrate the structure of the overlapping portion 320 after being irradiated by the laser. The overlapping portion 320 of the metal conductor 316 and the gate line 305 of the previous pixel are electrically connected through the molten metal 330. Thus, the gate signal of the previous pixel may directly transmit to the pixel electrode 312 of the current pixel through the molten metal 330 and the contact hole 318 so as to convert the white defect into a black defect and achieve the repair purpose.

Accordingly, it is a merit that such a pattern of the metal conductor 316 does not decrease the aperture ratio of the pixel. Next, because the metal conductor 316 is located in the source-drain layer, it may be formed at the same time with the source electrode and drain electrode. Thus, there is no additional photo mask or fabricating process is added. Accordingly, the embodiment of the present invention also provides an easy way to repair a white defect of the pixel without the need to use a laser to melt the pixel electrode.

Figure 4A:
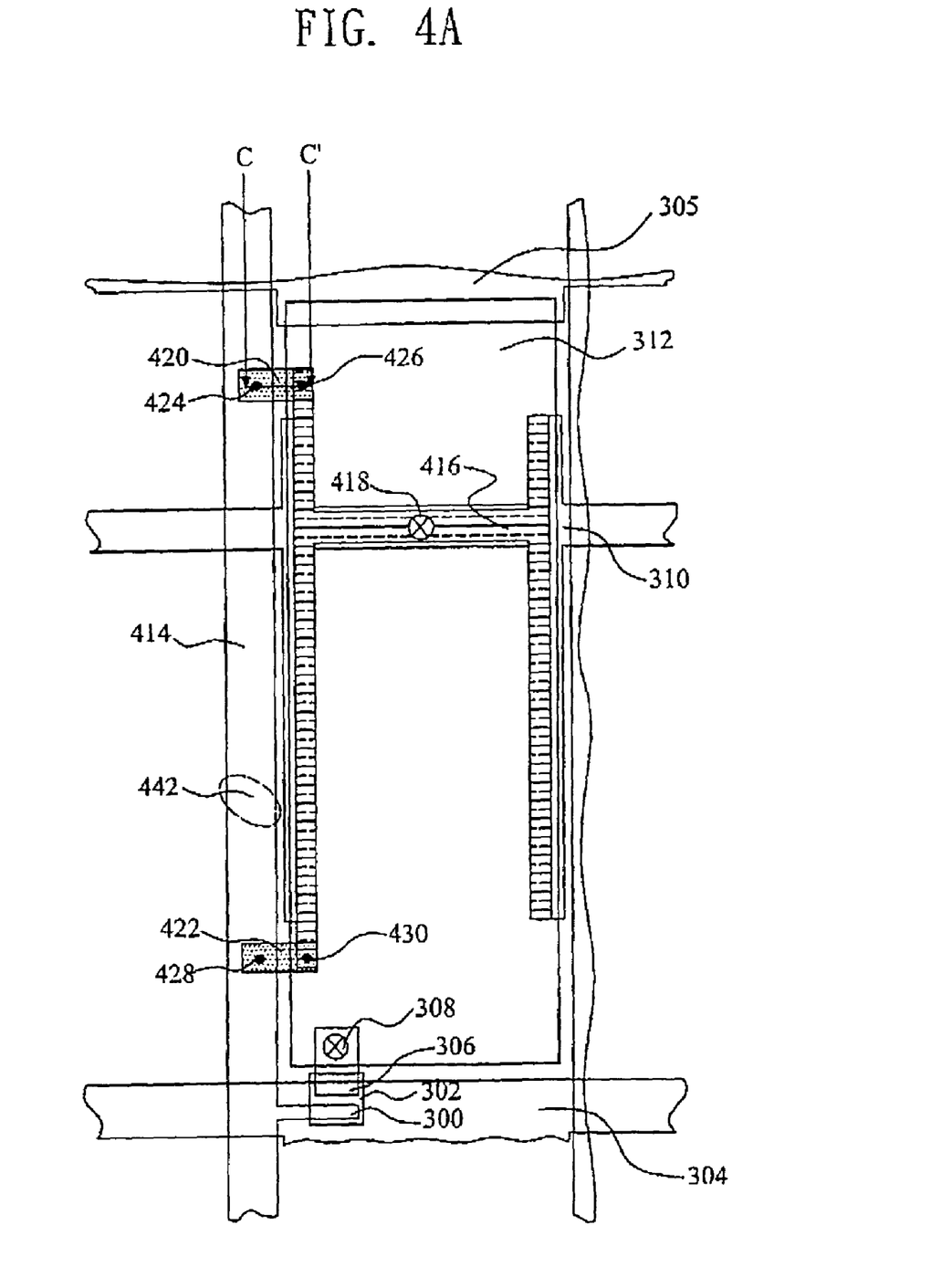
FIG. 4A is a top-view schematic diagram of a pixel with the laser repair structure in a TFT panel according to a second embodiment of the present invention.

Another embodiment of the present invention is illustrated in the FIG. 4A. Data line 414 transmits the data signal to the source electrode 300. A contact hole 418 is to electrically connect the metal conductor 416 to the pixel electrode 312. Different from the embodiment shown in FIG. 3A, two other additional metal conductors 420, 422, which are formed in the same layer with the gate line 304 of the current pixel and are normally floating, are also prepared for the required laser repair. The metal conductors 420, 422 are partially overlapped with the data line 414 and the metal conductor 416 at the overlapped portions 424, 428 and 426, 430 separately. Normally the material of the metal conductor 416 and the metal conductors 420, 422 is one or combination selected from the group consisting of Al, Cu, Au, Cr, Ta, Ti, Mn, Ni, Mo, Nb, Nd, and Ag.

Figure 4B:
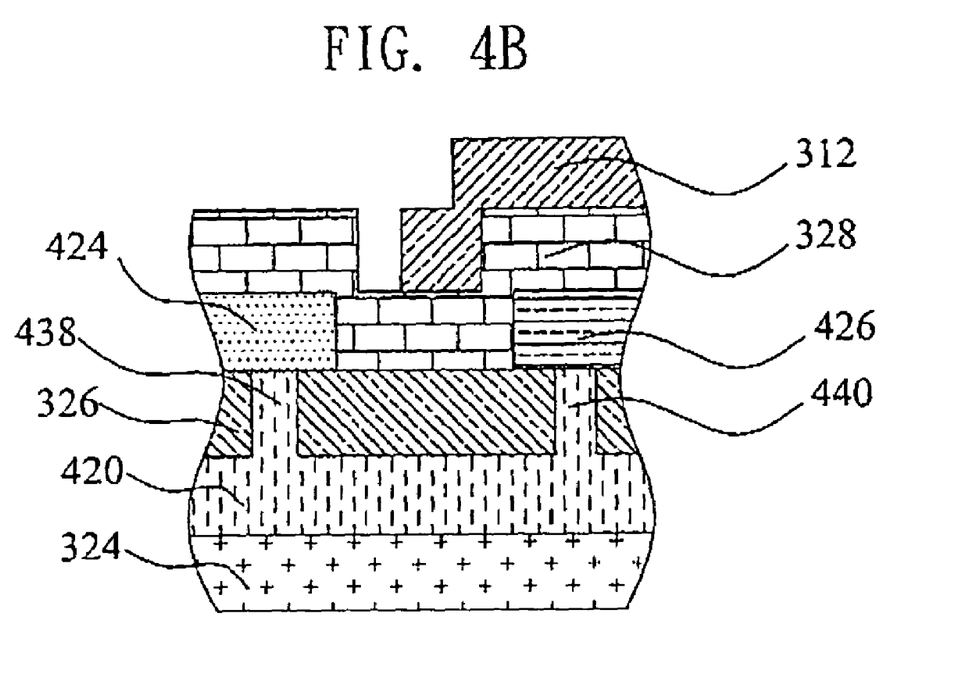
FIG. 4B is a cross-sectional schematic diagram taken from the cross-line C-C' in FIG. 4A to illustrate a pixel with the laser repair structure in a TFT panel after being irradiated by the laser.

FIG. 4B is a cross-sectional schematic diagram taken from the cross-line C-C' in FIG. 4A. The metal conductor 420 is on the substrate 324. Originally both the overlapped portion 424 of the data line 414 and the overlapped portion 426 of the metal conductor 416 are electrically isolated from the metal conductor 420 by a gate insulator 326 before being irradiated by the laser. A passivation insulator 328 is located between the pixel electrode 312 and the overlapped portion 426 of the metal conductor 416.

Once a white defect of the pixel has been found, the laser beams may be used to irradiate either one of the two groups of the overlapped portions 428, 430 of the metal conductor 422 and 424, 426 of the metal conductor 420 from the lower surface side of the substrate 324. For example, refer to FIG. 413, after the overlapped portions 424, 426 are irradiated by the laser, the data line 414 and the metal conductor 416 are electrically connected through the molten metals 438, 440. Then, the data signal may directly transmit to the pixel electrode 312 through the contact hole 418 and so as to convert the white defect into a dull defect and achieve the repair purpose.

Another purpose of this embodiment of the present invention is to repair the line defect of the data line. Once an open-circuited portion 442 in FIG. 4A of the data line 414 has been found, the laser beams may be used to irradiate both the two groups of the overlapped portions 428, 430 of the metal conductor 422 and 424, 426 of the metal conductor 420 from the lower surface side of the substrate 324. Thus, the data line 414 is electrically connected to the metal conductors 422, 420 at the overlapped portions 428, 424 separately. And the metal conductor 416 is electrically connected to the metal conductors 422, 420 at the overlapped portions 430, 426. Therefore, the data signal may be bypassed from the overlapped portion 424 to the overlapped portion 428 without passing though the open-circuited portion 442. In other words, the data line 414 can transmit the data signal through the metal conductor 416 and so as to achieve the repair purpose.

In this embodiment, the region of the metal conductor 416 having a contact hole 418 is within the region of the storage capacitance line 310. Like the previous embodiment, this kind of design will not decrease the aperture ratio of the pixel, neither.

Because the metal conductor 416 is located in the source-drain layer, it can be formed at the same time with the source electrode and drain electrode. And the metal conductors 420, 422 are located in the gate-electrode layer, it can be formed simultaneously with the gate electrode. Thus, there is no additional photo mask or fabricating process compared to the TFT Panel without repair structure is added for this embodiment.

Similar to the aforementioned embodiment, this embodiment provides an easy way to repair the white defect of the pixel and the open-circuited data line without the need to use a laser to melt the pixel electrode. This embodiment is advantageous that it may be applied to repair not only a white defect of the pixel but also a line defect of the data line.

To sum up the above descriptions, the present invention provides a convenient and easy way to repair a white defect of the pixel. The purpose is achieved by first setting up a first metal conductor located in the source-drain layer and having a contact hole to the pixel electrode. One important feature of the present invention is that the region of the first metal conductor is within the region of the storage capacitance line, so that the aperture ratio of the pixel will not decrease.

Next, there are two different kinds of embodiments for the present invention to repair a white defect of a pixel. One embodiment is to make extending portions of the first metal conductor to overlap with the gate line of the previous pixel such that they can be electrically connected by the laser irradiation in the following repair step. This kind of structure and method will repair a white defect to a dark defect.

Another embodiment of the present invention is to setup second metal conductors located in the gate-electrode layer and partially overlapped with the data line and the first conductor separately such that they can be electrically connected by the laser irradiation in the following repair step. This kind of structure and method will repair a white defect to a dull defect. In additional to repair the pixel defect, this kind of structure can repair an open-circuited data line by setting up two second metal conductors. Accordingly, the present invention has an advantage that it can repair not only a pixel defect but also a line defect of the data line.

One important feather of the present invention is that it is not necessary to use a laser to melt the pixel electrode.

Another feather of the present invention is that there is no additional photo mask or fabricating process compared to the TFT panel without the repair structure is needed to practice the present invention.

Consequently, the present invention of the laser repair structure and method can effectively elevate the repair yield and lower down the production cost.

The foregoing descriptions of specific embodiments of the present invention have been presented for purposes of illustrations and description. They are not intended to be exclusive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to particular use contemplated. It is intended that the scope of the invention be defined by the Claims appended hereto and their equivalents.

What is claimed is:

1. A laser repair structure of a TFT panel, comprising a plurality of pixels, wherein each of said pixels further comprises:
   a substrate;
   a gate line formed on said substrate and extending in a row direction;
   a storage capacitance line formed on said substrate and separated from said gate line;
   a gate insulator formed on said substrate and covering said gate line and said storage capacitance line;
   a data line formed on said gate insulator and extending in a column direction;

a passivation insulator covering said data line;

a pixel electrode formed on said passivation insulator; and a metal conductor formed on said gate insulator and lying within the region of said storage capacitance line except for at least one extending portion extended from the edge of said storage capacitance line thereto and partially overlapped with the gate line of said pixel on a previous row, wherein said metal conductor is electrically connected to said pixel electrode through a first contact hole, and both said storage capacitance line and said gate line of said pixel on a previous row are electrically isolated from said metal conductor by said gate insulator.

2. The laser repair structure according to claim 1, further comprising a semiconductor electrode formed on said gate insulator.

3. The laser repair structure according to claim 2, further comprising a drain electrode formed on said semiconductor electrode and electrically connected to said pixel electrode through a second contact hole.

4. The laser repair structure according to claim 1, wherein the material of said metal conductor is selected from the group consisting of Al, Cu, Au, Cr, Ta, Ti, Mn, Ni, Mo, Nb, Nd, Ag and the combination thereof.

5. The laser repair structure according to claim 1, wherein the material of said substrate is transparent glass.

6. The laser repair structure according to claim 1, wherein the material of said pixel electrode is selected from the group consisting of indium tin oxide (ITO) and indium zinc oxide (IZO).

7. The laser repair structure according to claim 1, wherein the material of said gate insulator and said passivation insulator is selected from the group consisting of oxide and nitride.

* * * * *